(12) United States Patent
Hubner et al.

(10) Patent No.: US 7,436,072 B2
(45) Date of Patent: Oct. 14, 2008

(54) PROTECTED CHIP STACK

(75) Inventors: Holger Hubner, Baldham (DE); Berndt Gammel, Markt Schwaben (DE)

(73) Assignee: Infineon Technologies AG (DE)

( * ) Notice: Subject to any disclaimer, the term of this patent is extended or adjusted under 35 U.S.C. 154(b) by 430 days.

(21) Appl. No.: 11/351,322

(22) Filed: Feb. 8, 2006

(65) Prior Publication Data
US 2006/0279002 A1 Dec. 14, 2006

(30) Foreign Application Priority Data
Feb. 8, 2005 (DE) .................. 10 2005 005 622

(51) Int. Cl.
*H01L 23/48* (2006.01)
(52) U.S. Cl. ............... 257/778; 257/786; 257/E23.175
(58) Field of Classification Search .................. 257/778; 438/108
See application file for complete search history.

(56) References Cited

U.S. PATENT DOCUMENTS

| | | | | |
|---|---|---|---|---|
| 4,933,898 A | * | 6/1990 | Gilberg et al. | 365/53 |
| 5,072,331 A | * | 12/1991 | Thiele et al. | 361/767 |
| 5,369,299 A | * | 11/1994 | Byrne | 257/638 |
| 5,468,990 A | * | 11/1995 | Daum | 257/632 |
| 5,824,571 A | | 10/1998 | Rollender et al. | |
| 6,414,884 B1 | * | 7/2002 | DeFelice et al. | 365/195 |

FOREIGN PATENT DOCUMENTS

WO WO-00/67319 A1 11/2000

* cited by examiner

*Primary Examiner*—Trung Dang
(74) *Attorney, Agent, or Firm*—Dickstein, Shapiro, LLP.

(57) ABSTRACT

A protected chip stack having a first chip and a second chip on the first chip. A functional layer in at least the first chip or the second chip. On the first chip and on the second chip there is in each case a connecting element, the connecting element on the first chip forming with the connecting element on the second chip a mechanical connection between the two chips. The connecting element and the functional layer are made of the same material. At least in the case of the first chip or in the case of the second chip, the connecting element is in direct contact with the functional layer.

20 Claims, 3 Drawing Sheets

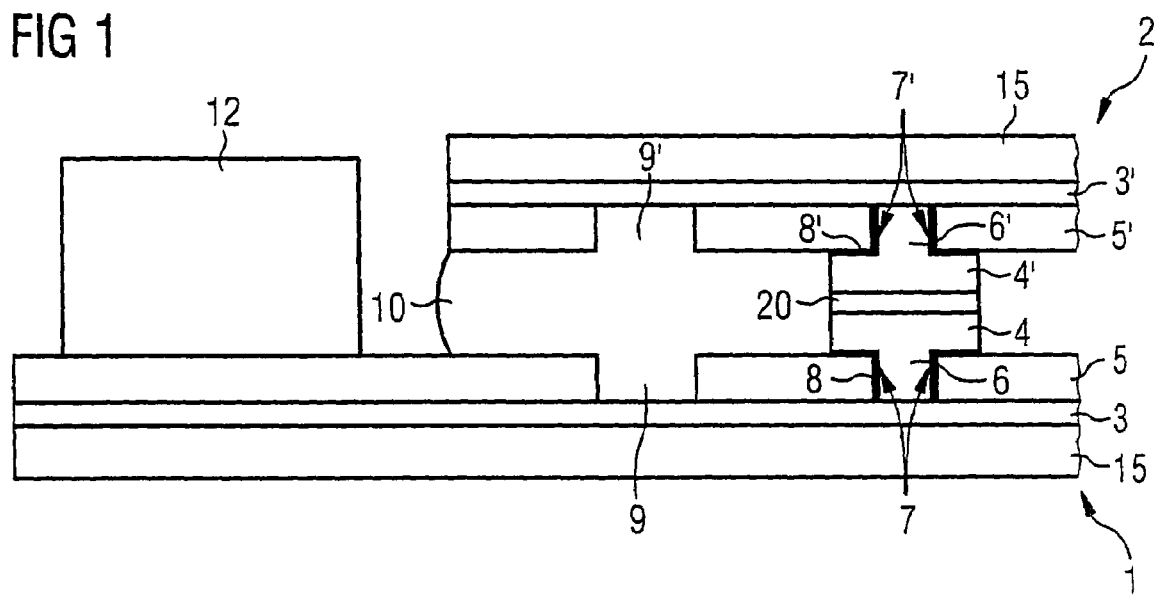

PROTECTED CHIP STACK

CROSS-REFERENCE TO RELATED APPLICATION

This application claims priority to German Patent Application Serial No. 102005005622.9, which was filed on Feb. 8, 2005, and is incorporated herein by reference in its entirety.

FIELD OF THE INVENTION

The invention relates to a protected chip stack and a method for producing a protected chip stack.

BACKGROUND OF THE INVENTION

In the case of current semiconductor devices (chips), there is the risk that information stored in them can be read out by unauthorized persons, by the operating mode of the chips being analyzed.

A large number of protective measures intended to protect the chips against unauthorized access are therefore already in existence.

For example, there are shielding measures, security-enhancing sensors (light sensors, glitch sensors, etc.) or special encapsulations of the chip, which are intended to prevent its analysis.

A further possible way of protecting the chips against unauthorized access is offered by what is known as "face-to-face" (F2F) technology.

In the case of F2F technology, the chips are made to face one another in such a way that the respective surfaces with the functional elements of the chip contained in them are arranged on one another. The surfaces are connected to one another in an electrically conductive manner, for example by soldering or adhesive bonding, by means of special contact pads.

In the case of a protected chip stack, this connection of the chip surfaces is formed in such a way that the two chips lying one on top of the other can only be separated with great effort. Attempts to separate them by increasing the temperature or mechanically shearing them apart lead to destruction of the chips before the connection that is formed is released.

Therefore, a protected chip stack is to be understood as meaning a stack of chips which is intended to prevent sensitive information contained in it from being found out by means of a secure connection between the stacked chips.

Nevertheless, in the case of the current protected chip stacks there is still the possibility of separating the two connected chips by means of chemical attack without destroying them and consequently, by analysis of the chip, to read out information contained in it.

Such an attack can be averted by cryptographic protocols. However, this requires the use of encryption algorithms, such as for example a block cipher (for example DES, AES) or a stream cipher. In many products, the implementation of such complex algorithms is out of the question, either for reasons of cost or for reasons of efficiency.

SUMMARY OF THE INVENTION

The object of the invention is to provide a protected chip stack with a secure connection between the chips.

The protected chip stack according to the invention has a first chip and a second chip on the first chip; a functional layer in at least the first chip or the second chip, the functional layer being necessary for the functionality of the chip; a connecting element respectively on the first chip and on the second chip, the connecting element on the first chip forming with the connecting element on the second chip a mechanical connection between the two chips, and the connecting element and the functional layer being made of the same material and, at least in the case of the first chip or in the case of the second chip, the connecting element being in direct contact with the functional layer.

Furthermore, the object is achieved according to the invention by a method for producing the protected chip stack having the steps of: preparing a first chip and a second chip, at least the first chip or the second chip having a functional layer that is necessary for the functionality of the chip; providing a connecting element on the first chip and on the second chip such that, at least in the case of the first chip or in the case of the second chips the connecting element is directly contacted with respect to the functional layer, the connecting element and the functional layer consisting of the same material; and connecting the first chip to the second chip such that the connecting element of the first chip forms a connection with the connecting element of the second chip.

BRIEF DESCRIPTION OF THE DRAWINGS

The invention is explained in more detail below on the basis of the figures, in which:

FIG. 1 shows a schematic cross-sectional view of a protected chip stack;

Figure 2A:
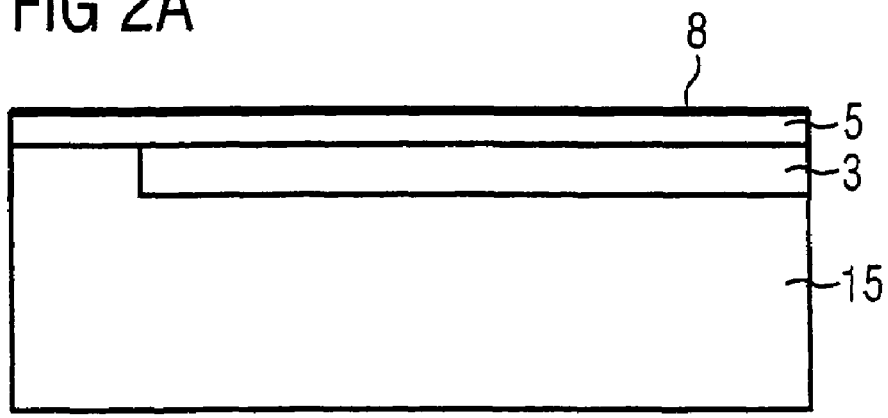
FIGS. 2A-2C show a schematic sectional representation to explain a method for producing a protected chip stack.

Structural features that remain the same are provided hereafter with the same designations.

DETAILED DESCRIPTION OF PREFERRED EMBODIMENTS OF THE INVENTION

The basic principle of the invention is that an attempt to separate the chips in a chip stack by a chemical attack leads to the destruction of at least one chip.

To separate the chip stack into its individual chips, the mechanical connection between the chips would necessarily have to be released. For this purpose, the connecting elements would have to be destroyed. However, the chemical required for this would also destroy the functional layer of the chip that is directly in contact with the connecting element, since this functional layer consists of the same material as the connecting element and consequently has the same chemical reactions.

The fact that this functional layer is absolutely necessary for the functionality of the chip means that such a chemical attack would also lead to the functionality of the chip being destroyed.

With this purely structural measure in the configuration of the protected chip stack, complex cryptography for the encryption of the communication between the first chip and the second chip is avoided. This saves chip area and costs.

In one embodiment of the protected chip stack, the material of the connecting element and of the functional layer is copper. Copper has already been used for some time in modern chip technologies as a metal for conducting paths. The use of copper for the functional layer and for the connecting element consequently does not present any new challenge for the technology to be used, but has all the necessary properties, such as for example good electrical conductivity, processability, process compatibility etc., to allow it to be used as a connecting element and as a functional layer.

It is a development of the protected chip stack according to the invention if a passivation layer with at least a first opening is applied to the functional layer in such a way that the first opening exposes a first contact region of the functional layer, and the connecting element is provided in the first opening. The passivation layer thereby protects the functional layer against disturbing environmental influences, while the exposed contact region makes it possible for the functional layer to be directly contacted with respect to the connecting element through the opening.

A refinement of the protected chip stack provides that the first opening has a diameter D of >10 μm. As a result, adjustment inaccuracies occurring during contact lithography in subsequent method steps are avoided.

It is another refinement if a barrier layer is applied to flanks of the first opening. This avoids the connecting element that protrudes through the opening coming into contact with the passivation layer. Reliability is increased as a result, because there is no formation of holes (voids) at the locations provided with a barrier layer because of diffusion processes between the passivation layer and the connecting element. The barrier layer serves at the same time as an adhesive layer for the connecting element.

In a further embodiment, there is at least a second opening, which exposes a second contact region of the functional layer. The second opening allows direct access to the functional layer, because no connecting element is provided in the second opening. The fact that the second opening is free would mean that, in the event of a chemical attack to separate the chip stack, the chemical thereby used would cause particularly severe damage to the functional layer through the second opening, because the chemical can act on the functional layer during the entire time period up to the separation of the chip stack.

A refinement of the protected chip stack provides that the second opening has a diameter D of >20 μm. Through this large opening, the chemical used for an attempt to separate the chip stack can reach the functional layer particularly easily, and consequently lead to particularly severe destruction of the functional layer.

A further embodiment of the protected chip stack according to the invention provides that the second opening is made in the passivation layer in the edge region of the chip. This is intended to ensure that the chemical used for the separation of the chip stack rapidly produces its destructive effect on the functional layer. Structures that are more in the middle are better protected and are only attacked by the chemical later and more slowly.

In a development, the first opening is made in the passivation layer by way of finely structured locations of the functional layer. Finely structured is to be understood in this connection as meaning the smallest possible structure size that can be produced by a technology used for the production of the chips. The finely structured locations with structure sizes of currently smaller than 0.2-0.3 μm are distinguished by the fact that they cannot be repaired, or only with considerable effort. This means that, in the event of a chemical attack, the functional layer undergoes virtually irreversible damage due to the strategic placement of the opening.

It is a development of the same nature if the second opening is made in the passivation layer by way of finely structured locations of the functional layer.

One embodiment of the protected chip stack according to the invention provides that there is a filling material between the first chip and the second chip alongside the connecting element. The filling material makes it more difficult for the chemical to attack the connecting element, in particular whenever the filling material and the connecting element have different chemical properties. Access to the connecting element is blocked by the filling material. Therefore, before a chemical attack on the connecting element, filling material first has to be removed by a separate chemical attack. Benzocyclobutene (BCB) or polybenzoxazol (PBO) or Teflon is used for example as the filling material. Furthermore, the filling material serves as an additional mechanical connection for the chips in the detector chip stack.

In an additional embodiment, a barrier layer is applied over the functional layer. This barrier layer serves as an adhesive and barrier layer for the connecting element. This increases the reliability of the connection.

It is a refinement of the protected chip stack if the first chip has a first region and a second region, the second chip being arranged over the first region and at least one terminal contact being provided on the second region. The terminal contact serves for contacting the entire chip stack with respect to an external unit. This allows the chip stack to be connected to other components to form a system.

In a further refinement of the protected chip stack, the second chip is thinned to a thickness d of <30 μm. As a result, the thinned second chip provides not only the advantage that the chip stack can be made very thin but also an additional security feature. If the second chip is separated from the first chip, it would no longer be possible for the second chip to be handled without auxiliary means, on account of its thinned state. Particularly in liquid media, it would break up immediately.

An attempt to use chemical means to separate the chip stack produced by the method would have the effect of destroying the functional layer, and consequently of destroying the chip. This is so because the chemical means for releasing the connection would not only attack the connecting element but also the functional layer consisting of the same material. Since, however, the intact functional layer is absolutely necessary for the functionality of the entire chip, destruction of the functional layer would be synonymous with destruction of the chip.

In a development of the method according to the invention, the provision of the connecting element is preceded by a passivation layer being applied to the functional layer and structured in such a way as to create at least one opening, which exposes a contact region of the functional layer. The application of the functional layer protects the functional layer against damaging environmental influences, while the opening made in the passivation layer also allows direct access to the functional layer. Consequently, the desired damage to the functional layer in the event of a chemical attack continues to be ensured.

In a further embodiment, the structuring of the passivation layer is preceded by a barrier layer being applied to the passivation layer. This is followed by the structuring of the barrier layer and the passivation layer with a common etching mask. The barrier layer is required in order that no holes (voids) are caused by diffusion processes between the passivation layer and the connecting element. Furthermore, the barrier layer also serves as an adhesive layer for the connecting element.

The structuring of the barrier layer and the passivation layer with a common etching mask to produce the opening eliminates a process step in the production method. Furthermore, adjustment inaccuracies that would occur if there are two different etching masks are avoided. The opening is consequently produced through the barrier layer and the passivation layer at an exactly defined location.

In an alternative embodiment, the structuring of the passivation layer is followed by a barrier layer being applied to the passivation layer, to flanks of the opening and to the contact region and structured in such a way that the contact region is exposed again. In this case, it is of particular importance that this type of production also allows the preparation of a barrier layer on the flanks of the openings. This avoids any formation of holes due to diffusion processes between the passivation layer and the connecting element also at the flanks of the opening, and consequently increases the reliability of the chip stack. In addition, the barrier layer is also used as an adhesive layer for the connecting element, which likewise leads to an increase in reliability as a result of the good adhesion of the connecting elements in the opening.

In FIG. 1, the configuration of a protected chip stack according to the invention is represented in a schematic cross-sectional view.

The protected chip stack is made up of a lower first chip 1 and a second chip 2 placed on it.

The first chip 1, and similarly the second chip 2, have a substrate 15, in which a functional layer 3 of copper is contained.

On this functional layer 3 there is a passivation layer 5. Openings, which partially expose the functional layer 3, are made in this passivation layer 5.

A first opening 6 is filled with a connecting element 4. The connecting element 4 likewise consists of copper and is directly adjacent the functional layer 3.

Between the connecting element 4 and the passivation layer 5 there is a barrier layer 8 of titanium tungsten or tantalum. The barrier layer 8 covers the flanks 7 of the first opening 6 and the passivation layer 5 from above.

A second opening 9 is located in the passivation layer 5 and exposes the functional layer 3.

The configuration described up to now applies both to the first chip 1 and to the second chip 2.

The second chip 2 is placed onto the first chip 1 in such a way that the respective connecting elements 4 of the first chip and of the second chip lie opposite one another. This arrangement is known as "face-to-face" technology.

The mechanical connection between the respectively opposite connecting elements 4 forms an intermetallic connection 20.

This intermetallic connection 20 becomes Cu3Sn if, in a way corresponding to the copper connecting elements, a layer of tin is thermally treated between the connecting elements.

Gaps remaining between the first chip 1 and the second chip 2 are filled with a filling material 10, such as for example benzocyclobutene (BCB) or polybenzoxazol (PBO) or Teflon.

The gaps may take the form of a meander, blind holes or narrow fissures.

The first chip 1 is larger in its base area than the second chip 2. The second chip 2 consequently covers only part of the base area of the first chip 1.

On the part of the chip 1 that is not covered by the second chip 2 there is a terminal contact 12 of aluminum. Together with further terminal contacts that are not represented in FIG. 1, this forms a "trough", in which the second chip 2 is inserted.

Figure 2B:
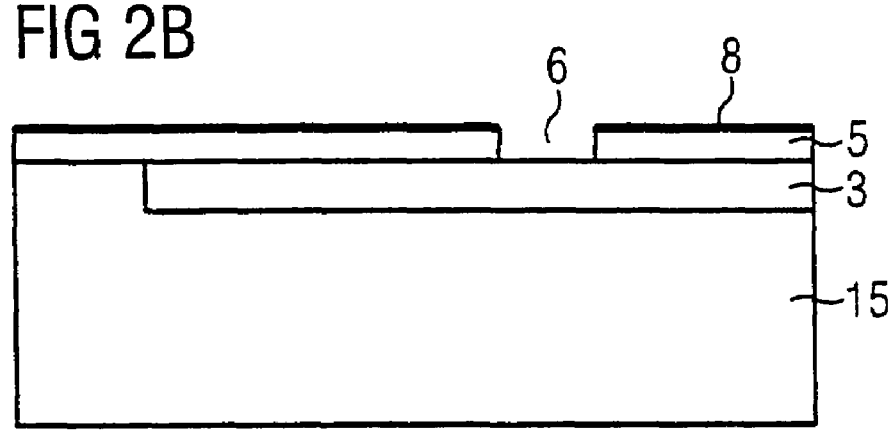
Figure 2C:
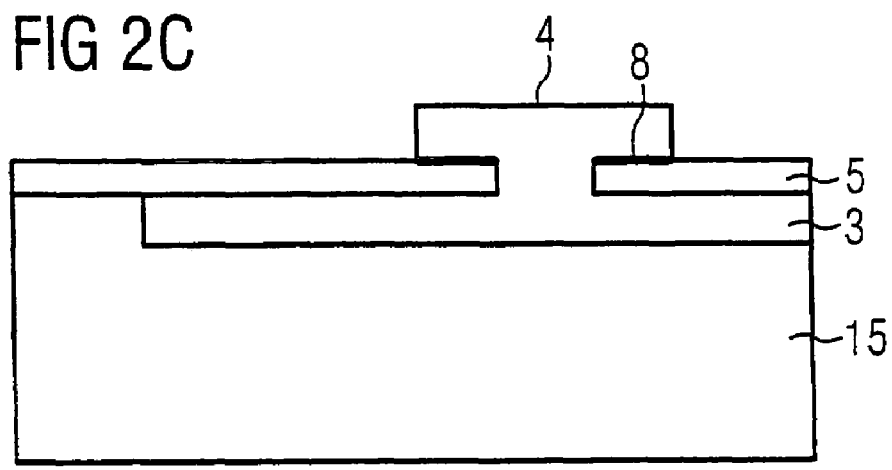

FIGS. 2A-C show a method for producing a connecting element for a protected chip stack is represented in a number of production steps.

The substrate 15, which is generally a semiconductor substrate, and which contains a functional layer 3, is prepared with a passivation layer 5 over the functional layer 3.

A barrier layer 8 of titanium tungsten is sputtered onto this passivation layer 5 over its full surface area. Both this barrier layer 8 and the passivation layer 5 are structured by a common lithographic process, so that the first opening 6 is created. The first opening 6 exposes part of the functional layer 3.

Subsequently, the first opening 6 is filled with a connecting element 4 of copper. Outside the first opening 6, the connecting element 4 also extends over part of the passivation layer 5, the barrier layer 8 that exists between the passivation layer 5 and the connecting layer 4 serving both as an adhesive layer for the adequate adhesion of the connecting element 4 on the passivation layer 5 and as a barrier layer against diffusion processes occurring between the passivation layer 5 and the connecting element 4.

The barrier layer 8 lying next to the connecting element 4 on the passivation layer 5 is removed for subsequent process steps.

The interface between the connecting element 4 and the functional layer 3 consequently does not have a boundary layer, but instead there is a seamless transition between the two copper elements.

Figure 3A:
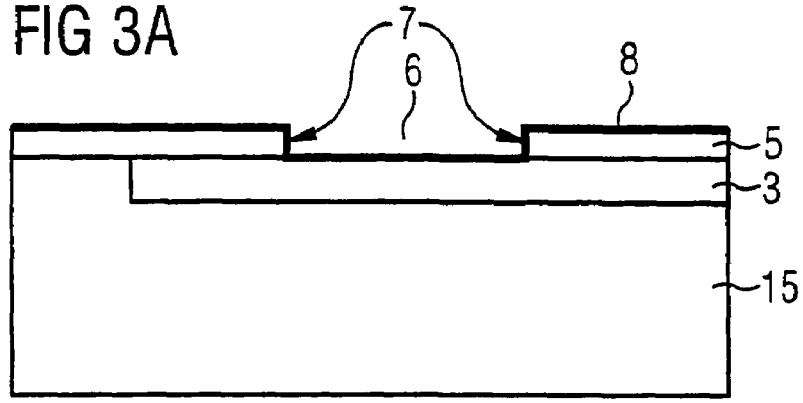
FIGS. 3A-3C show a schematic sectional representation to explain an alternative method for producing a protected chip stack.
Figure 3B:
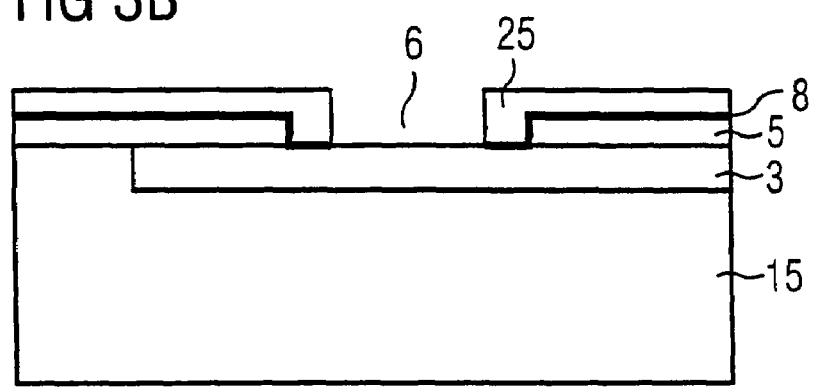
Figure 3C:
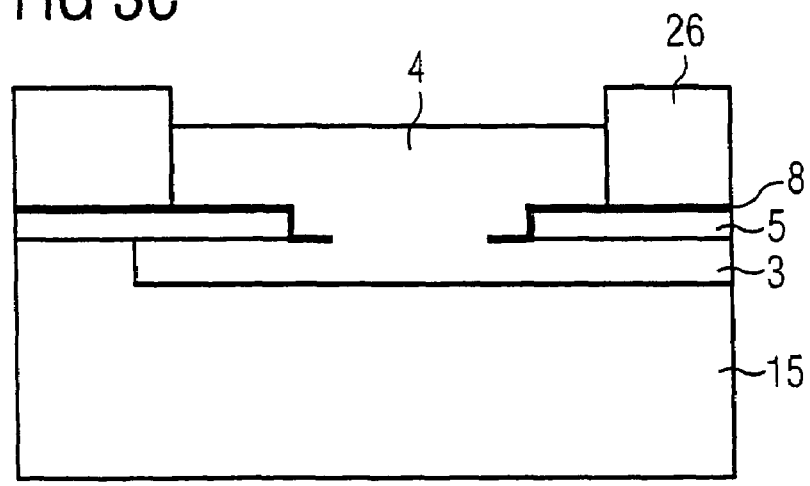

FIGS. 3A-C show an alternative method for producing a connecting element for a protected chip stack is represented in successive production steps.

A substrate 15, which contains a functional layer 3, is prepared with a passivation layer 5 over the functional layer 3, a first opening 6, which exposes part of the functional layer 3, having already been made in the passivation layer.

A barrier layer 8 of titanium tungsten is sputtered onto the passivation layer 5, onto the flanks 7 of the first opening 6 and onto the exposed part of the functional layer 3.

This barrier layer 8 is then structured with the aid of an additional mask 25 in a lithographic process in such a way as to create in the barrier layer 8 a window, which in turn exposes part of the functional layer in the first opening 6.

Subsequently, the mask 25 is removed and a further mask 26 is applied to the barrier layer 8 over the passivation layer 5.

The further mask 26 contains a mask opening, this mask opening extending over the first opening 6 and over the region of the passivation layer 5 that is adjacent the first opening 6.

Consequently, the mask opening allows access to the exposed part of the functional layer 3.

The mask opening is filled with the connecting element 4 of copper. As a result, the first opening 6 is also filled with the connecting element 4 of copper and, outside the first opening 6, the connecting element 4 also extends over part of the passivation layer 5. Between the passivation layer 5 and the connecting element 4 and between the flanks 7 of the first opening 6 and the connecting element 4 there is still the barrier layer 8, which serves in the same way as in the exemplary embodiment relating to FIGS. 2A-C as a barrier and adhesive layer.

The interface between the connecting element 4 and the functional layer 3 does not have a boundary layer, but instead a seamless copper-copper transition is also created here between the connecting element 4 and the functional layer 3.

What is claimed is:

1. A protected chip stack, comprising:
a first chip and a second chip on the first chip;
a functional layer in at least the first chip or the second chip, wherein the functional layer is necessary for the functionality of the chip; and
a connecting element respectively on the first chip and on the second chip, the connecting element on the first chip forming with the connecting element on the second chip a mechanical connection between the two chips, wherein the connecting element and the functional layer are made of the same material and, at least in the case of the first chip or in the case of the second chip, the connecting element is in direct contact with the functional layer.

2. The protected chip stack as claimed in claim 1, wherein the material of the connecting element and of the functional layer is copper.

3. The protected chip stack as claimed in claim 1, further comprising a passivation layer having at least a first opening applied to the functional layer such that the first opening exposes a first contact region of the functional layer, and the connecting element is provided in the first opening.

4. The protected chip stack as claimed in claim 3, wherein the first opening has a diameter D of >10 μm.

5. The protected chip stack as claimed in claim 3, further comprising a barrier layer applied to flanks of the first opening.

6. The protected chip stack as claimed in claim 3, wherein the passivation layer has at least a second opening, which exposes a second contact region of the functional layer.

7. The protected chip stack as claimed in claim 6, wherein the second opening has a diameter D of >20 μm.

8. The protected chip stack as claimed in claim 6, wherein the second opening is formed in the passivation layer in the edge region of the chip.

9. The protected chip stack as claimed in claim 3, wherein the first opening is formed in the passivation near finely structured locations of the functional layer.

10. The protected chip stack as claimed in claim 6, wherein the second opening is formed in the passivation layer near finely structured locations of the functional layer.

11. The protected chip stack as claimed in claim 1, further comprising a filling material formed between the first chip and the second chip alongside the connecting element.

12. The protected chip stack as claimed in claim 1, further comrpising a barrier layer applied over the functional layer.

13. The protected chip stack as claimed in claim 1, wherein the first chip has a first region and a second region, the second chip is arranged over the first region, and at least one terminal contact is provided on the second region.

14. The protected chip stack as claimed in claim 1, wherein the second chip has a thickness d of <30 μm.

15. The protected chip stack as claimed in claim 1, further comprising an intermetallic connection between the connecting element on the first chip and the connecting element on the second chip.

16. The protected chip stack as claimed in claim 1, wherein there is a seamless transition between the connecting element and the functional layer.

17. A method for producing a protected chip stack, comprising the steps of:

preparing a first chip and a second chip, at least the first chip or the second chip having a functional layer, wherein the functional layer is necessary for the functionality of the chip;

providing a connecting element respectively on the first chip and on the second chip such that, at least in the case of the first chip or in the case of the second chip, the connecting element directly contacts the functional layer, and the connecting element and the functional layer consist of the same material; and connecting the first chip to the second chip such that the connecting element of the first chip forms a connection with the connecting element of the second chip.

18. The method as claimed in claim 17, before providing the connecting element, applying a passivation layer to the functional layer structured so as to create at least one opening, which exposes a contact region of the functional layer.

19. The method as claimed in claim 18, before structuring the passivation layer, applying a barrier layer to the passivation layer, and then structuring the barrier layer and the passivation layer with a common etching mask.

20. The method as claimed in claim 18, after structuring the passivation layer, applying a barrier layer to the passivation layer, to flanks of the opening and to the contact region such that the contact region is exposed again.

* * * * *